United States Patent [19]

Keller

[11] Patent Number: 4,538,279
[45] Date of Patent: Aug. 27, 1985

[54] INDUCTION COIL IN THE FORM OF A PANCAKE COIL FOR CRUCIBLE-FREE ZONE MELTING

[75] Inventor: Wolfgang Keller, Munich, Fed. Rep. of Germany

[73] Assignee: Siemens Aktiengesellschaft, Berlin and Munich, Fed. Rep. of Germany

[21] Appl. No.: 514,166

[22] Filed: Jul. 15, 1983

[30] Foreign Application Priority Data

Jul. 16, 1982 [DE] Fed. Rep. of Germany ....... 3226713

[51] Int. Cl.³ .......................... C03B 20/00; H05B 6/44
[52] U.S. Cl. ....................................... 373/139; 336/62; 219/10.49 R
[58] Field of Search ...................... 373/139; 219/10.79, 219/10.41, 10.43, 10.49 R; 336/62

[56] References Cited

U.S. PATENT DOCUMENTS 2,870,309  1/1959  Capita .................................. 373/139
3,644,151  2/1972  Keller .
4,184,135  1/1980  Gupta et al. ................. 219/10.79 X

FOREIGN PATENT DOCUMENTS 2737342 of 0000  Fed. Rep. of Germany .

Primary Examiner—A. D. Pellinen
Assistant Examiner—Hong K. Choe
Attorney, Agent, or Firm—Herbert L. Lerner; Laurence A. Greenberg

[57] ABSTRACT

A pancake induction heating coil for crucible-free zone melting of semiconductor crystal rods, includes a primary winding surrounding a semiconductor rod to be remelted in the form of a ring through which cooling liquid flows, a secondary winding surrounding the primary winding and having a side facing the semiconductor rod, and an energy concentrator lying in the plane of the primary winding and having a circular opening formed substantially in the center thereof for the semiconductor rod, the side of the secondary winding facing the semiconductor rod being electrically conductingly connected to the energy concentrator.

27 Claims, 10 Drawing Figures

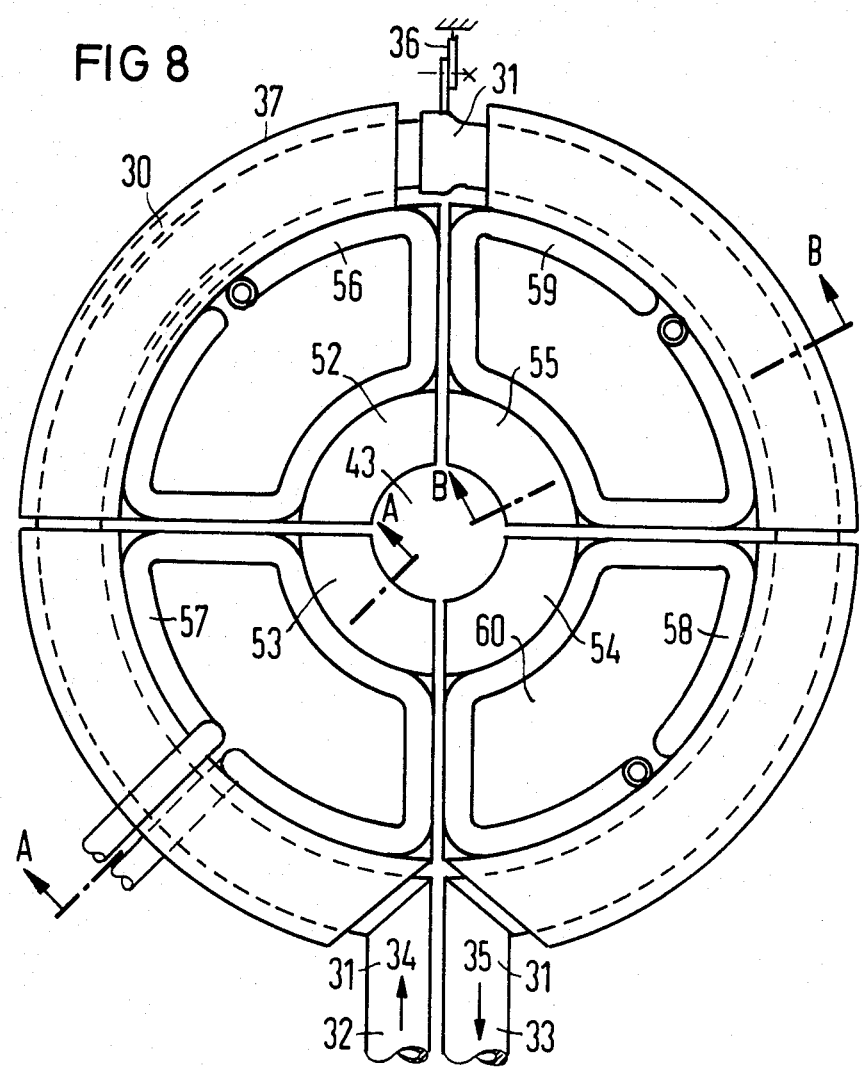
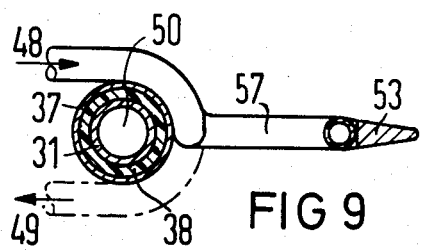
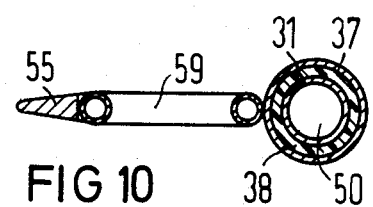

INDUCTION COIL IN THE FORM OF A PANCAKE COIL FOR CRUCIBLE-FREE ZONE MELTING

The invention relates to a device for crucible-free zone melting of a crystalline rod, especially a semiconductor rod, with a melting chamber in which holders for the ends of the rod are disposed, and an induction heating coil surrounding the rod for heating the melting zone.

Devices for crucible-free zone melting of a crystalline rod frequently have an induction heating coil for heating the melting zone, besides holders for the ends of the rod. A relative motion between the rod mountings on one hand and the induction heating coil on the other hand, moves the melting zone through the crystalline rod. The induction heating coil may be a multi-turn cylindrical or solenoid coil. Frequently, however, the induction coil is a single-turn coil. The induction heating coil is supplied with high-frequency a-c current from a high-frequency generator.

The melting chamber may be evacuated to a high degree, but it may also be filled with a protective gas. Protective gas fillings, such as high-purity hydrogen or argon have been proposed. In such gases, rod-shaped individual crystals with particularly good crystal quality can be obtained by crucible-free zone melting.

Multi-turn coils in particular, and even single-turn coils, have a tendency to break down electrically in crucible-free zone melting. These breakdowns can have a detrimental effect on the crystal quality of the crystalline rod obtained by the crucible-free zone melting. The danger of breakdowns is particularly great in a melting chamber filled with protective gas and/or with coils operated at high power.

Such a device is already the subject of U.S. Pat. No. 3,644,151. In that device the central portion of the winding of the induction heating coil and the crystalline rod are connected to the same electric potential during the passage of the melting zone.

In a further development of this idea it is provided that the central portion of the winding, or the central turn of the induction heating coil, and at least one of the rod holders, are connected to each other in an electrically conducting manner. An electrical symmetrizing member may also be connected parallel to the induction heating coil. The center tap of the member is connected in an electrically conducting manner to at least one rod holder.

Electric breakdowns have no longer been observed since initiating the use of the device described in U.S. Pat. No. 3,644,151 in customary silicon rods with one to two inches diameter.

When fusing-on the seed crystal and drawing the bottleneck-like constriction at the beginning of the zone melting process, relatively high voltages are required in the melting coil due to the poor coupling between the coil and the melting zone. The larger the inside diameter of the melting coil, which may, for instance, be in the form of a pancake coil, the easier it is for glow discharges or breakdowns to occur in the coil gap, especially if argon is used as the protective gas. These breakdowns have a very detrimental effect on the crystal quality of the semiconductor material produced by the crucible-free zone melting, and in addition, they destroy the RF coil and leads.

The trend toward thicker rods of three, four or five inches in diameter, however, makes it necessary to find a new solution.

The invention starts out from the insight that pancake coils which are known per se and are described, for instance, in German Published, Non-Prosecuted Application DE-OS No. 27 37 342 are retained as far as the basic structure is concerned, but must be completely reconstructed as far as their capability of transmitting energy and their dielectric strength are concerned.

It is accordingly an object of the invention to provide an induction heating coil in the form of a pancake oil for crucible-free zone melting, which overcomes the hereinafore-mentioned disadvantages of the heretofore-known devices of this general type, and which prevents the electrical breakdown discussed above.

With the foregoing and other objects in view there is provided, in accordance with the invention, a pancake induction heating coil for crucible-free zone melting of semiconductor crystal rods, especially silicon rods, comprising a primary winding surrounding a semiconductor rod to be remelted in the form of a ring through which cooling liquid flows, the primary winding may have a hollow body or it may have holes through which the cooling liquid flows, a secondary winding surrounding the primary winding and having a side facing the semiconductor rod, and an energy concentrator lying in the plane of the coil and having a circular opening formed substantially in the center thereof for the semiconductor rod, the side of the secondary winding facing the semiconductor rod being electrically conductingly connected to the energy concentrator.

In accordance with another feature of the invention, there is provided a central grounding terminal attached to the primary winding.

In accordance with a further feature of the invention, the primary and/or secondary winding is a hollow cylinder.

In accordance with an added feature of the invention, the secondary winding concentrically surrounds the primary winding.

In accordance with an additional feature of the invention, the primary and secondary windings are spaced apart defining a space therebetween, and including temperature-resistant insulating material filling the space.

In accordance with again another feature of the invention, the energy concentrator is a hollow body or has holes through which the cooling liquid flows.

In accordance with again a further feature of the invention, the energy concentrator is in the form of a ring surrounding the rod, and including a tube for carrying cooling water forming the electrical and mechanical connection between the energy concentrator and the secondary winding.

In accordance with again an added feature of the invention, in both cases the energy concentrator is hard soldered to the secondary winding.

For improving the dielectric strength, it has been proposed in U.S. Ser. No. 426,781 (filed on Sept. 29, 1982) to divide the energy concentrator of a single-turn heating coil into segments, a measure which can be used to advantage in a coil according to the present invention. Therefore, in accordance with again an additional feature of the invention, the energy concentrator is subdivided into a plurality of segments, preferably two, three, four or six.

In accordance with yet another feature of the invention, there are provided respective potential terminals connected in vicinity of the center of each of the segments, preferably suited for grounding.

The basic idea, on which the measures according to the present invention are based, includes subdividing the heating coil into a primary, circuit and, in a further embodiment, into a completely developed secondary circuit (see U.S. Ser. No. 426,781). In this case, the alternating magnetic field is fully preserved and is delivered through an energy concentrator to the semiconductor rod to be melted, while the electric field of the coils is divided down accordingly by dividing the energy concentrator into individual segments.

In accordance with yet a further feature of the invention, the energy concentrator and the secondary winding form a structural unit.

In accordance with yet an added feature of the invention, the segments increase in thickness radially outwardly from the central opening.

In accordance with yet an additional feature of the invention, the segments are conical.

In accordance with still another feature of the invention, the segments have notches formed in the outer surface in which the primary winding is fitted.

In accordance with still a further feature of the invention, the notches are substantially 20 mm deep.

In accordance with still an added feature of the invention, the segments are substantially 10 to 30 mm thick at the outer surface thereof.

In accordance with still an additional feature of the invention, the segments and the primary winding are spaced apart by a distance of substantially 1 to 2 mm.

In accordance with another feature of the invention, the segments are tapered toward the center of the energy concentrator and have a radius of curvature of 0.5 to 2 mm at the center of the energy concentrator. In accordance with a further feature of the invention, the central opening in the energy concentrator is formed by the segments and has a diameter of substantially 20 to 40 mm. In accordance with an added feature of the invention, the primary winding has an outside diameter of substantially 80 to 200 mm.

In accordance with an additional feature of the invention, the segments of the energy concentrator have radially outer rims having notches formed therein for receiving the primary winding, and including a metal enclosure covering the notches and being electrically connected to the energy concentrator. Thus, the primary coil lies in a slot of the concentrator segments, being metallically closed at the outer rim. This results in stronger coupling between the primary coil and the concentrator and accordingly results in a substantial improvement of the efficiency of the heating device.

In accordance with again another feature of the invention, the primary winding is spaced from the segments in the notches defining a space therebetween, and including temperature-resistant insulating material filling the space.

In accordance with again a further feature of the invention, the temperature-resistant insulating material is chosen from the group consisting of ceramics, silicone rubber, silicone resin and polybismaleinimide.

In accordance with a concomitant feature of the invention, the energy concentrator is formed of a material chosen from the group consisting of copper, silver-coated copper and silver.

Other features which are considered as characteristis for the invention are set forth in the appended claims.

Although the invention is illustrated and described herein as embodied in an induction coil in the form of a pancake coil for crucible-free zone melting, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIGS. 8, 9 and 10 are views corresponding to FIGS. 3, 4 and 5, respectively, of another embodiment of the invention.

Figure 1:
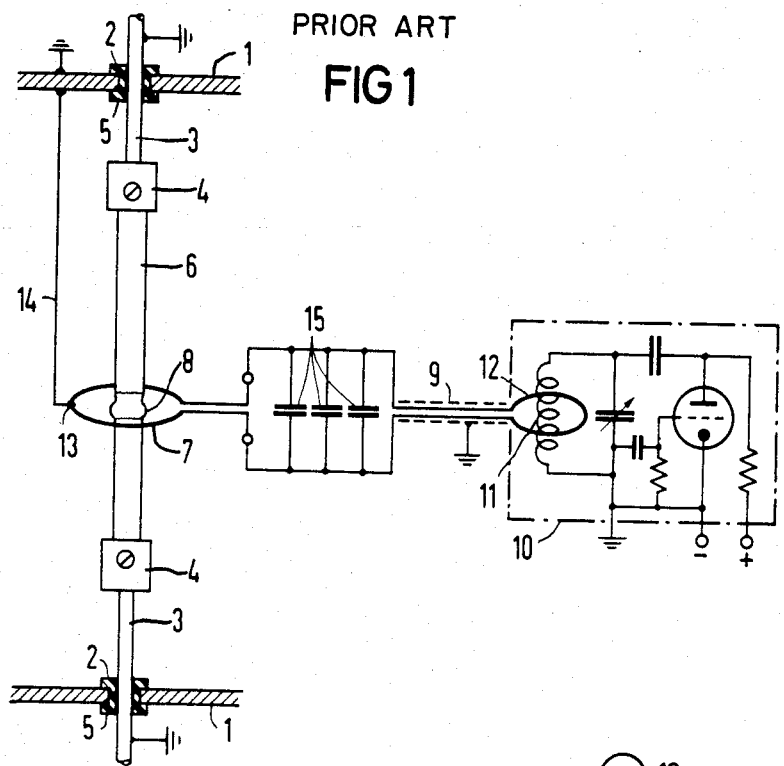
FIG. 1 is a fragmentary, diagrammatic, front elevational view and a schematic circuit diagram, of a prior art device for crucible-free melting.

Referring now to the figures of the drawing in detail and first particularly to FIG. 1 thereof, there is seen a conventional device for crucible-free zone melting of a crystalline rod, according to U.S. Pat. No. 3,644,151, discussed above. The figure illustrates sections of a metallic wall 1 of a melting chamber for crucible-free zone melting of a crystalline rod 6. The wall 1 contains feedthroughs 2, in which metallic shafts 3 with metallic rod holders 4, are disposed. The feedthroughs 2 are sealed in a gas-tight manner by means of a sealing ring gasket 5. The shafts 3 and therefore the rod holders 4 as well, can be rotated about the axis of the shaft 3 and can also be moved in the axial direction. One end of the crystalline rod 6, such as a silicon rod, is fastened in each of the rod holders 4. An induction heating coil 7 is provided, which generates a melting zone 8 in the rod 6 that is moved along the rod 6 by a relative motion between the rod 6 and the induction heating coil 7. The melting chamber, which is not shown in its entirety, may be filled with high-purity hydrogen or with argon.

Capacitors 15 are shunted across the inducting heating coil 7. The induction heating coil 7 and the capacitors 15 form a heating circuit, i.e., a tuned circuit which is supplied with electric energy from a high-frequency generator 10 through a coaxial line 9. The coaxial line 9 and therefore the heating circuit formed of the induction heating coil 7 and the capacitors 15, is coupled by a coupling coil 12 to a resonant coil 11 of a tank circuit in the high-frequency generator 10.

A central turn portion 13 of the single-turn induction coil 7 (or in the case of a solenoid induction heating coil, the central turn itself) is connected to the wall 1 of the melting chamber by an electric line 14. The rod holders 4 and therefore the rod 6, as well as the central turn portion 13 of the induction heating coil 7, have the same potential, since the shafts 3 and the wall 1 of the melting chamber are grounded. The maximum potential difference between the induction heating coil 7 and the crystalline rod 6 is therefore only one-half of what it would be if the central turn portion 13 of the induction heating coil 7 were not connected to the wall of the melting chamber in an electrically conducting manner, and therefore did not have the same potential as the rod 6.

Figure 2:
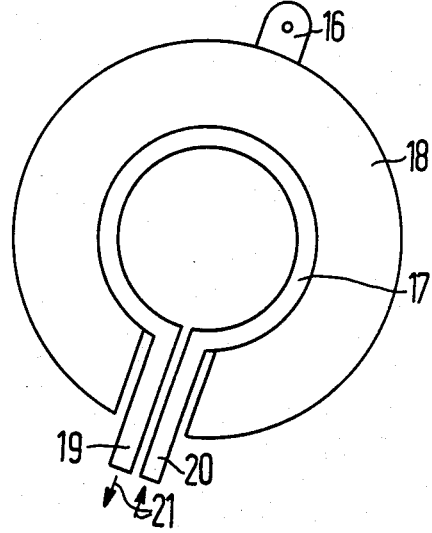
FIG. 2 is a top plan view of a prior art pancake coil.

The invention starts out from a conventional pancake, flat or disc coil, shown in a top view in FIG. 2. The coil is formed of an annular inner wall part 17 having an oval cross section and an outer winding part 18 in the shape of a collar. The two parts 17 and 18 of the winding are firmly connected to each other by a welded seam. The outer winding part 18 contains an extension in the form an eye 16, at which the coil is grounded. Two leads 19 and 20 for the coils are connected to the inner part 17, and simultaneously serve as cooling water conduits, the flow of the water being indicated by arrows 21. In general, the outer part of the winding 18, is solid and is formed of silver-plated copper, while the inner winding part 17 is made of copper tubing.

Figure 3:
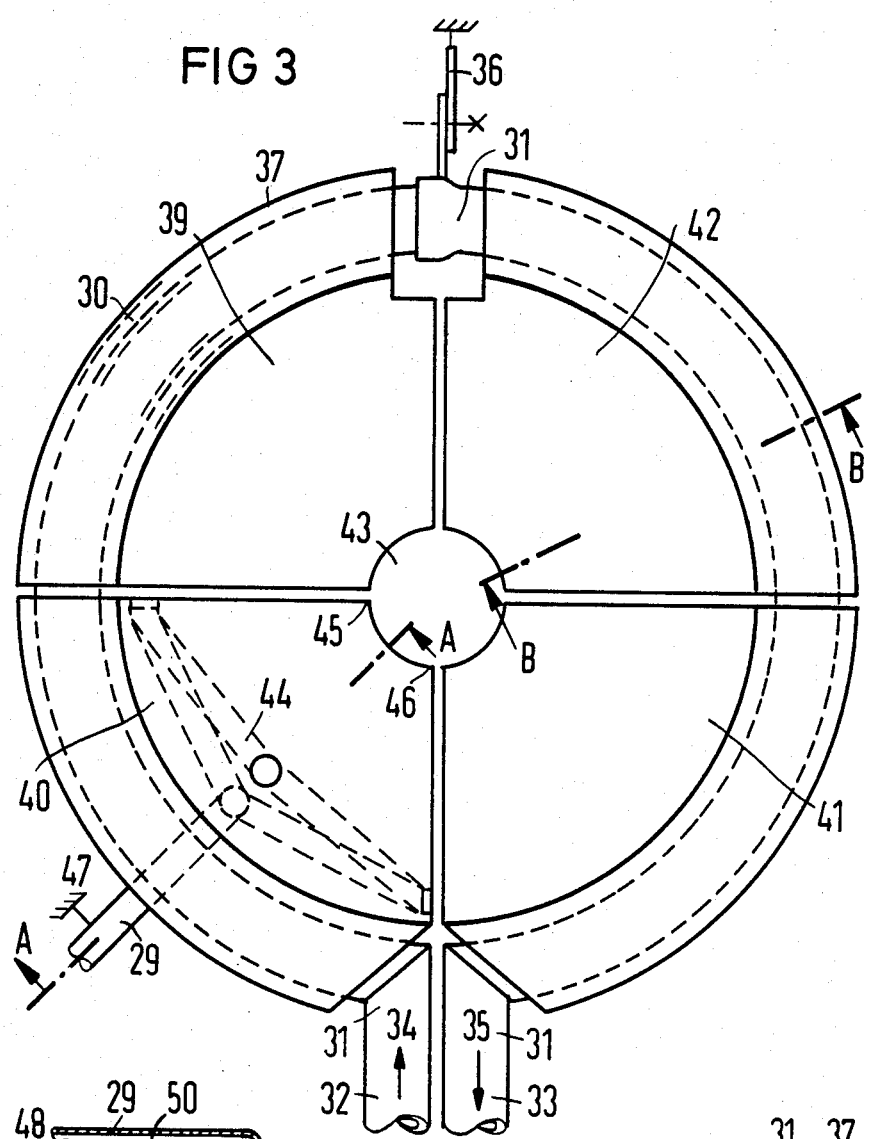
FIG. 3 is a top plan view of one embodiment of the heating coil according to the invention.

The heart of the heating coil of the invention shown in FIG. 3, is a single-turn pancake coil or winding 31 which acts as a primary winding and has ends 32 and 33 to which a high-frequency voltage such as 1000 V, is applied. For the purpose of cooling, cooling liquid which is preferably water, flows through the coil 31, the indicated by the arrows 34 and 35. The winding itself is formed, in particular, of silver-plated copper tubing with a diameter of about 20 mm.

To increase the dielectric strength, the winding 31 has a ground terminal 36 in its central region. The winding 31 is at least partially surrounded by a second winding 37 which acts as a secondary winding. In the present embodiment, this secondary winding 37 is a tube which is formed of copper, silver-plated copper or silver, and surrounds the primary winding 31 completely and concentrically except for a few open places which are necessary for proper operation.

A space 30 left between the two windings 31 and 37 is filled with a temperature-resistant insulating material. Ceramics, silicone rubber, silicone resin or polybismaleinimide are particularly suitable as insulating material. Disposed on the inside facing the semiconductor rod to be remelted, is an energy concentrator which lies in the plane of the coil and has a circular opening 43 toward the center for the semiconductor rod to be remelted.

In the present embodiment, the energy concentrator is subdivided into four segments 39, 40, 41 and 42. In the simplest case, each segment is constructed as a hollow copper body, or holes 44 are provided, to which a cooling line system can be conveniently connected through a water line tube 29, as shown in the segment 40. The energy concentrator 39, 40, 41, 42 is hard-soldered to the secondary winding 37.

The energy concentrator is divided into several segments as mentioned above (see U.S. Ser. No. 426,781). It is possible through the use of this measure, to substantially increase the dielectric strength of the heating coil. If, for instance, the secondary winding has a voltage of 1000 V relative to the semiconductor rod which is at ground potential, the voltage of each segment is reduced by a corresponding share. If four segments are used, 250 V drop at each segment. If central grounding of each segment is used, the voltage which each segment has relative to the grounded melt, is halved once again (analogously to the voltage division according to U.S. Pat. No. 3,644,151 (and U.S. Ser. No. 426,781). The critical voltage between the melt and the ends of the segments (the ends 45 and 46 in the case of the segment 40), is again reduced by a factor of 2.

In practice, it has been found to be practical to use a coil having an opening formed by the segments for bringing-through the semiconductor rod to be remelted, which has a diameter of 20 to 40 mm, with an outside diameter of the heating coil of 80 to 200 mm.

Figure 4:
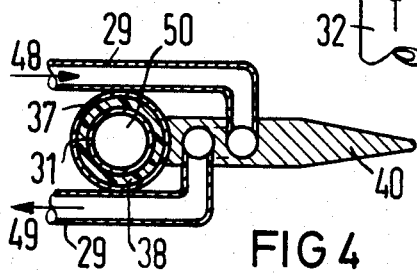
FIG. 4 is a cross-sectional view taken along the line A—A in FIG. 3, in the direction of the arrows.
Figure 5:
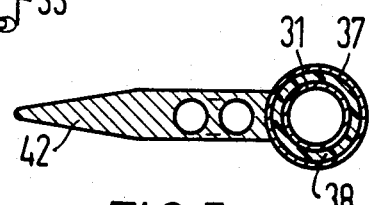
FIG. 5 is a cross-sectional view taken along the line B—B in FIG. 3, in the direction of the arrows.

To better illustrate the invention, the section A—A of FIG. 1 is shown in FIG. 4 and the section B—B thereof is shown in FIG. 5. The reference symbols chosen in FIG. 4 and FIG. 5 are the same as those used in FIG. 3. The cooling water for the energy concentrator is conducted in accordance with arrows 48 and 49. Cooling water likewise flows through the interior 50 of the tube 31 which acts as the primary winding, as already explained.

Figure 6:
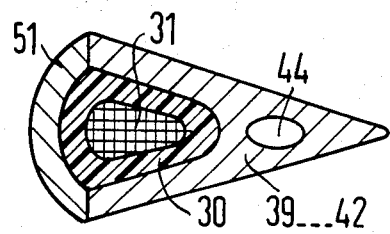
FIG. 6 is a cross-sectional view of a segment of an energy concentrator according to a variation of FIG. 3.

As shown in FIG. 6, a technically streamlined structure is formed by the provision that the segments 39 to 42, which have a thickness that increases from the inside out and are preferably conical, have notches on the outside thereof into which the primary winding 31 is fitted. The intermediate space 30 is filled with a temperature-resistant silicone rubber 38. The segments are cooled by the hole 44, through which water can flow.

If the segments have a thickness of about 20 mm on the outside and if they have a radius of curvature of 1 mm on the inside, then the notch in the segments for receiving the winding 31 can be made 20 mm deep in spite of the hole 44.

Figure 7:
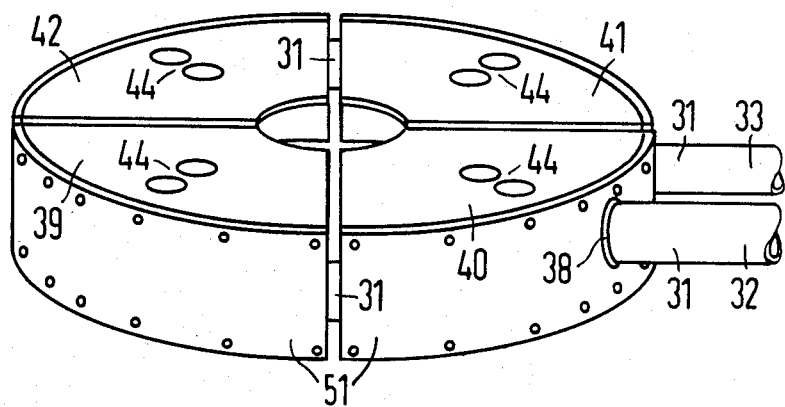
FIG. 7 is a perspective view of the device according to FIG. 3.

For completing the secondary winding, a cover 51 which is formed, for instance, of copper, is placed around the outside of the primary winding 31. As can be seen from FIG. 7, the secondary winding and the energy concentrator form a structural unit. In the FIG. 7 embodiment, the energy concentrator 39, 40, 41, 42 has a metal enclosure at its free or open outer rim, which is formed of a copper band 51 subdivided in accordance with the number of segments and electrically connected to the energy concentrator.

A variation of the invention which is mechanically simple to manufacture, may be seen from FIGS. 8, 9 and 10, wherein FIG. 9 represents the section A—A and FIG. 10 represents the section B—B of the apparatus shown in FIG. 8. As far as the parts are the same, the reference symbols agree with those of FIGS. 3 and 7. According to this embodiment, the energy concentrator is primarily formed of a ring which surrounds the semiconductor rod to be melted and which is subdivided in accordance with the desired segmentation. In the present case, segments 52, 53, 54 and 55 form the feedthrough opening 43 for the silicon rod to be melted.

The electrical and mechanical connection between the four parts of the secondary winding 37 and the concentrator ring 52, 53, 54, 55 divided in quarters, is formed separately for each individual segment by a tube that is suitable for carrying cooling water. For the four segments, these are the tubes 56, 57, 58 and 59 which are formed of silver-plated copper. The space circumscribed by these tubes, such as the space 60 in the case of the tube 57, may remain empty. However, it may equally well be filled by a metal, such as in the shape of a metal band.

In order to zone melt semiconductor crystal rods with large rod diameters, it is also possible, according to an embodiment following the technique of the invention, to construct the induction heating coil in such a way that it can be disassembled. In this case, a separation goes through the windings and the segments and two separate elements which result are connected together by screw connections and gaskets provided for the cooling medium.

The foregoing is a description corresponding in substance to German Application No. P 32 26 713.4, dated July 16, 1982, the International priority of which is being claimed for the instant application, and which is hereby made part of this application. Any material discrepancies between the foregoing specification and the aforementioned corresponding German application are to be resolved in favor of the latter.

I claim:

1. Pancake induction heating coil for cruciblefree zone melting of semiconductor crystal rod, comprising a primary winding surrounding a semiconductor rod to be remelted in the form of a ring through which cooling liquid flows, a hollow secondary winding surrounding said primary winding, and an energy concentrator lying in the plane of said primary winding and having a circular opening formed substantially in the center thereof for the semiconductor rod, said secondary winding and said energy concentrator each being subdivided into at least two segments being electrically separated from each other, each of said segments of said secondary winding being connected to a respective one of said segments of said energy concentrator.

2. Coil according to claim 1, wherein said primary winding is a hollow body through which the cooling liquid flows.

3. Coil according to claim 1, wherein said primary winding has holes formed therein for the cooling liquid.

4. Coil according to claim 1, including a central grounding terminal attached to said primary winding.

5. Coil according to claim 1, wherein said primary winding is a hollow cylinder.

6. Coil according to claim 1, wherein said secondary winding is a hollow cylinder.

7. Coil according to claim 1, wherein said primary and secondary windings are spaced apart defining a space therebetween, and including temperature-resistant insulating material filling said space.

8. Coil according to claim 1, wherein said energy concentrator is a hollow body through which the cooling liquid flows.

9. Coil according to claim 1, wherein said energy concentrator has holes formed therein through which the cooling liquid flows.

10. Coil according to claim 1, wherein said energy concentrator is in the form of a ring surrounding the rod, and including a tube for carrying cooling water electrically and mechanically connecting said energy concentrator to said secondary winding.

11. Coil according to claim 1, wherein said energy concentrator is hard-soldered to said secondary winding.

12. Coil according to claim 1, including respective potential terminals connected in vicinity of the center of each of said segments.

13. Coil according to claim 1, wherein said energy concentrator and said secondary winding form a single structural unit.

14. Coil according to claim 1, wherein said segments increase in thickness radially outwardly from said central opening.

15. Coil according to claim 14, wherein said segments are conical.

16. Coil according to claim 1, wherein said segments have notches formed in the outer surface thereof in which said primary winding is fitted.

17. Coil according to claim 16, wherein said notches are substantially 20 mm deep.

18. Coil according to claim 17, wherein said segments are substantially 10 to 30 mm thick at the outer surface thereof.

19. Coil according to claim 1, wherein said segments are tapered toward the center of said energy concentrator and have a radius of curvature of 0.5 to 2 mm at the center of said energy concentrator.

20. Coil according to claim 19, wherein said central opening in said energy concentrator is formed by said segments and has a diameter of substantially 20 to 40 mm.

21. Coil according to claim 20, wherein said primary winding has an outside diameter of substantially 80 to 200 mm.

22. Coil according to claim 18, wherein said segments and said primary winding are spaced apart by a distance of substantially 1 to 2 mm.

23. Coil according to claim 1, wherein said segments of said energy concentrator have radially outer rims having notches formed therein for receiving said primary winding, and including a metal enclosure covering said notches and being electrically connected to said energy concentrator.

24. Coil according to claim 23, wherein said primary winding is spaced from said segments in said notches defining a space therebetween, and including temperature-resistant insulating material filling said space.

25. Coil according to claim 7, wherein said temperature-resistant insulating material is chosen from the group consisting of ceramics, silicone rubber, silicone resin and polybismaleinimide.

26. Coil according to claim 24, wherein said temperature-resistant insulating material is chosen from the group consisting of ceramics, silicone rubber, silicone resin and polybismaleinimide.

27. Coil according to claim 1, wherein said energy concentrator is formed of a material chosen from the group consisting of copper, silver-coated copper and silver.

* * * * *